United States Patent
Baggenstoss

(10) Patent No.: US 7,880,255 B2
(45) Date of Patent: Feb. 1, 2011

(54) PIXEL CELL HAVING A GRATED INTERFACE

(75) Inventor: William J. Baggenstoss, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/893,276

(22) Filed: Jul. 19, 2004

(65) Prior Publication Data

US 2006/0011955 A1    Jan. 19, 2006

(51) Int. Cl.
*H01L 31/0236* (2006.01)
*H01L 31/0352* (2006.01)

(52) U.S. Cl. ............... 257/436; 257/466; 257/E31.038
(58) Field of Classification Search ................ 257/225, 257/258, 290, 291, 292, 432, 436, 461, 465, 257/466, 431, 458, 293, 294, E31.031, E31.038, 257/437, E31.032
See application file for complete search history.

(56) References Cited

U.S. PATENT DOCUMENTS

| | | | |
|---|---|---|---|
| 4,966,446 A * | 10/1990 | Huang et al. ................ 359/851 |
| 4,966,447 A * | 10/1990 | Huang et al. ................ 359/851 |
| 5,229,614 A * | 7/1993 | Andersson et al. ..... 250/370.12 |
| 5,455,708 A * | 10/1995 | Harris et al. ................ 359/226 |
| 5,497,269 A * | 3/1996 | Gal ............................ 359/615 |
| 5,682,265 A * | 10/1997 | Farn et al. ................... 359/571 |
| 5,770,469 A * | 6/1998 | Uram et al. ................. 438/246 |
| 5,920,380 A * | 7/1999 | Sweatt ........................ 355/77 |
| 6,140,630 A | 10/2000 | Rhodes |
| 6,204,524 B1 | 3/2001 | Rhodes |
| 6,310,366 B1 | 10/2001 | Rhodes et al. |
| 6,326,652 B1 | 12/2001 | Rhodes |
| 6,333,205 B1 | 12/2001 | Rhodes |
| 6,376,868 B1 | 4/2002 | Rhodes |
| 6,423,980 B1 * | 7/2002 | Wilson et al. ................. 257/21 |
| 6,444,897 B1 * | 9/2002 | Luque-Lopez et al. ...... 136/255 |
| 6,498,102 B2 * | 12/2002 | Kim et al. .................... 438/691 |
| 6,829,092 B2 * | 12/2004 | Amm et al. ................. 359/573 |
| 6,858,462 B2 * | 2/2005 | Zaidi et al. .................... 438/71 |
| 6,875,975 B2 * | 4/2005 | Faska et al. ............... 250/214.1 |
| 2002/0000244 A1 * | 1/2002 | Zaidi .......................... 136/259 |
| 2002/0063302 A1 * | 5/2002 | Furumiya et al. ........... 257/432 |

(Continued)

FOREIGN PATENT DOCUMENTS

EP    1 096 274 A2    5/2001

(Continued)

OTHER PUBLICATIONS

Molecular Expressions Microscopy Primer: Digital Imaging in Optical Microscopy—Intro, Authors: M. Davidson, K. Spring and T. Renato, copyright date: 1998-2006; mod. date: Jul. 16, 2004 pp. 8 or 13—topic: Sources and Remedies of Noise.*

(Continued)

*Primary Examiner*—Lynne A Gurley
*Assistant Examiner*—Andrew O Arena
(74) *Attorney, Agent, or Firm*—Dickstein Shapiro LLP

(57) ABSTRACT

A pixel cell having a photosensor within a silicon substrate; and an oxide layer provided over the photosensor, the oxide layer having a grated interface with said silicon substrate, and a method of fabricating the pixel cell having a grated interface.

37 Claims, 13 Drawing Sheets

U.S. PATENT DOCUMENTS

| | | | |
|---|---|---|---|
| 2002/0089004 A1* | 7/2002 | Rhodes | 257/290 |
| 2003/0026891 A1* | 2/2003 | Qiu et al. | 427/58 |
| 2003/0044729 A1* | 3/2003 | Huang et al. | 430/321 |
| 2003/0086649 A1* | 5/2003 | Zhou | 385/37 |
| 2004/0164370 A1* | 8/2004 | Kim et al. | 257/458 |
| 2005/0053347 A1* | 3/2005 | West et al. | 385/129 |
| 2005/0274988 A1* | 12/2005 | Hong | 257/225 |

FOREIGN PATENT DOCUMENTS

| | | |
|---|---|---|
| EP | 1 096 274 A3 | 4/2002 |
| JP | 2000012822 | 1/2000 |

OTHER PUBLICATIONS

Turchetta et al., "Introduction to CMOS Image Sensors", 1998, especially pp. 7-8 of 13 http://www.molecularexpressions.com/primer/digitalimaging/cmosimagesensors.html.*

Photodector. Wikipedia entry on "photodetector" retrieved from http://en.wikipedia.org/wiki/Photodector on Jan. 14, 2010.*

P. Arguel, et al., "A Monolithic Phase Measurement Photodetector," 2003, IEEE.

PCT Notification of Transmittal of the International Search Report and the Written Opinion of the International Searching Authority.

Written Opinion of the Australian Patent Office, Nov. 26, 2007.

Simion Astilean et al., "High-efficiency subwavelength diffractive element patterned in a high-refractive-index material for 633 nm," Optical Society of American, Optics Letters, vol. 23, No. 7, pp. 552-554, Apr. 1, 1998.

* cited by examiner

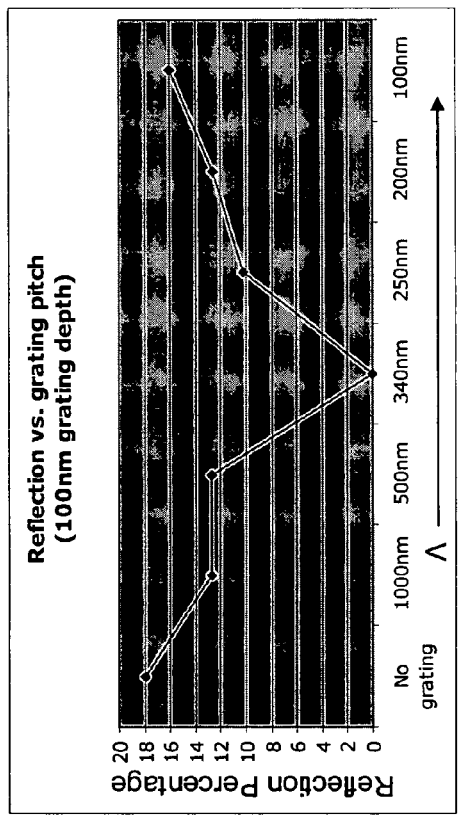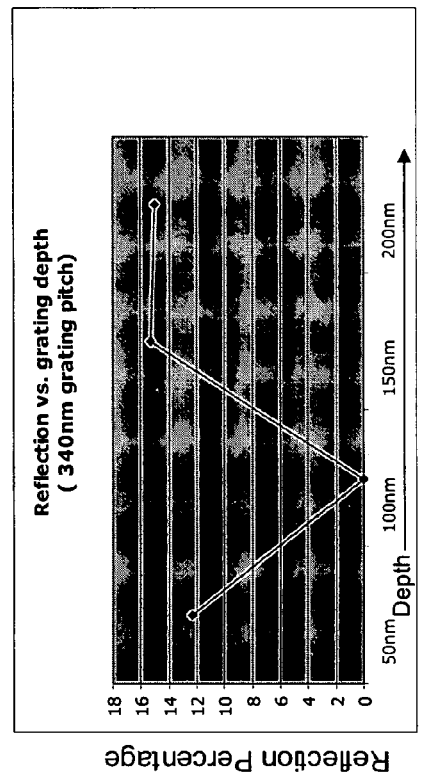

US 7,880,255 B2

PIXEL CELL HAVING A GRATED INTERFACE

FIELD OF THE INVENTION

The present invention relates generally to imaging devices, and particularly to a pixel cell having a grated interface, and a method of forming the pixel cell having a grated interface.

BACKGROUND OF THE INVENTION

Integrated circuits, including dies, for example, imager dies such as charge-coupled-devices (CCD) and complementary metal oxide semiconductor (CMOS) dies, have commonly been used in photo-imaging applications.

Imager dies, such as the CMOS imager die, typically contain thousands of pixels in a pixel array on a single chip. Pixels convert light into an electrical signal that can then be stored and recalled by an electrical device such as, for example, a processor. The electrical signals that are stored may be recalled to produce an image on, for example, a computer screen or a printable media.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, each of which being assigned to Micron Technology, Inc. The disclosures of each of the forgoing patents are hereby incorporated by reference in their entirety.

FIG. 1 illustrates a block diagram of an imager die 10, having a CMOS imager device 8 formed therein. The CMOS imager device 8 has a pixel array 15 that comprises a plurality of pixels arranged in a predetermined number of columns and rows. The pixel cells of each row in the pixel array 15 are all turned on at the same time by a row select line, and the pixel cells of each column are selectively output by respective column select lines. A plurality of row and column lines is provided for the entire pixel array 15. The row lines are selectively activated in sequence by a row driver 1 in response to a row address decoder 2 and the column select lines are selectively activated in sequence for each row activation by a column driver 3 in response to a column address decoder 4. The CMOS imager device 8 is operated by the control circuit 5, which controls the address decoders 2, 4 for selecting the appropriate row and column lines for pixel readout, and row and column driver circuitry 1, 3 for applying driving voltages to the drive transistors of the selected row and column lines.

The pixel output signals typically include a pixel reset signal $V_{rst}$ taken from a charge storage node when it is reset and a pixel image signal $V_{sig}$, which is taken from the storage node after charges generated by an image are transferred to the node. The $V_{rst}$ and $V_{sig}$ signals are read by a sample and hold circuit 6 and are subtracted by a differential amplifier 7 that produces a difference signal ($V_{rst}$-$V_{sig}$) for each pixel cell, which represents the amount of light impinging on the pixels. This difference signal is digitized by an analog-to-digital converter (ADC) 9. The digitized pixel difference signals are then fed to an image processor 11 to form and output a digital image. In addition, as depicted in FIG. 1, the CMOS imager device 8 may be included on a single semiconductor chip to form the imager die 10.

A partial cross-sectional view of a conventional pixel cell 13 that could be incorporated into the pixel array 15 of FIG. 1 is illustrated in FIG. 2. The illustrated pixel cell 13 typically includes a photosensor 12 having a p-region 12a and n-region 12b in a p-type substrate 14. The substrate 14 is typically a p-type silicon substrate. The p-region 12a of the photosensor 12 is typically coupled to the potential of the p-substrate 14 for efficient operation of the photosensor 12. The pixel cell 13 also includes a transfer transistor with associated gate 16, a floating diffusion region 18 formed in a more heavily doped p-type well 20, and a reset transistor with associated gate 22. The reset transistor 22 has an associated source/drain region 30 connected to a supply voltage Vaa-pix that is used to reset the floating diffusion region 18 to a predetermined charge level (i.e., supply voltage Vaa-pix level) prior to charge transference.

In operation, incident light 36 from a light source 38 striking the surface of the p-region 12a of the photosensor 12 generates electrons that are collected in the n-region 12b. When the transfer gate 16 is on, the generated electrons in the n-region 12b are transferred to the floating diffusion region 18 as a result of the potential difference existing between the photosensor 12 and the floating diffusion region 18. The floating diffusion region 18 is coupled to the gate of a source follower transistor 24, which receives the charge stored by the floating diffusion region 18 and transfers a voltage corresponding to the charge to a first source/drain terminal of a row select transistor 26. When a row select control signal RS goes high, the voltage corresponding to the generated charge is transferred to the column line 28 where it is further processed by sample/hold and processing circuits such as the sample and hold circuit 6 (FIG. 1).

The illustrated pixel cell 13 is formed between two isolation regions, or shallow trench isolation (STI) regions 32. The STI regions 32 prevent crosstalk between adjacent pixels, as pixel cell 13 is only one of hundreds or thousands of pixels that can be incorporate into the pixel array of an imager die (e.g., pixel array 15 of imager die 10 (FIG. 1)).

The pixel cell 13 is typically formed with an oxide layer 34 over the surface of the substrate 14. Various other layers (not shown) are typically deposited over the pixel cell 13. For example, a tetraethyl orthosilicate ($Si(OC_2H_5)_4$) (TEOS) layer may be deposited over the oxide layer 34. Similarly, a boro-phospho-silicate glass (BPSG) layer could be deposited over the TEOS layer. A metallization layer and insulating layer can also be deposited over the pixel cell 13.

One adverse effect of depositing the oxide layer 34 over the substrate 14 is the reflection of incident light 36. In operation, incident light 36 from the light source 38 encounters the oxide layer 34 before striking the p-region 12a of the photosensor 12. The index of refraction for the oxide layer can be as low as 1.6; whereas the index of refraction of the substrate 14 (formed of silicon) can be as high as 4.0. The abrupt transition from an index of refraction of 1.6 to 4.0 results in a high percentage of incident light reflection 40. The percentage of incident light 36 that is reflected can be determined using the following formula:

$$\text{Reflection} = |X-Y|^2/(X+Y)^2; \qquad (1)$$

wherein X represents the index of refraction of the oxide layer 34, and Y represents the index of refraction of the substrate 14. In the above-described example, the reflection percentage is $|4.0-1.6|^2/(4.0+1.6)^2 \sim 18\%$. Therefore, the photosensor 12 fails to capture approximately 18% of the incident light 36 to which it is exposed. This is undesirable.

Accordingly, there is a desire and need for a pixel cell that can capture a greater percentage of incident light by reducing the percentage of incident light that is reflected.

BRIEF SUMMARY OF THE INVENTION

The present invention provides a pixel cell that can capture a greater percentage of incident light, as compared to conventional pixels.

The present invention relates to a pixel cell having a photosensor within a silicon substrate and an oxide layer provided over the photosensor, wherein the oxide layer has a grated interface with the silicon substrate. The grated interface allows a greater percentage of incident light to be captured, which is a vast improvement over the art.

BRIEF DESCRIPTION OF THE DRAWINGS

The above-described features and advantages of the invention will be more clearly understood from the following detailed description, which is provided with reference to the accompanying drawings in which:

FIGS. 5A and 5B are graphs illustrating the percentage of reflection as a function of varying the depths of the trenches forming the basis of a grated interface and the periods of the grated interface.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "semiconductor substrate," "silicon substrate," and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. When reference is made to the substrate in the following description, previous process steps may have been utilized to form regions or junctions in or over the base semiconductor or foundation.

The term "pixel," as used herein, refers to a photo-element unit cell containing a photosensor for converting photons to an electrical signal. For purposes of illustration, a single representative pixel and its manner of formation are illustrated in the figures and description herein; however, typically fabrication of a plurality of like pixels proceeds simultaneously. Accordingly, the following detailed description is not to be taken in a limiting sense, and the scope of the present invention is defined only by the appended claims.

The terms "grated interface" or "grating," as used herein, refer to an interface between two material layers, wherein one of the two material layers has at least one trench, and the other of the two material layers is provided within and over the at least one trench.

Figure 2:
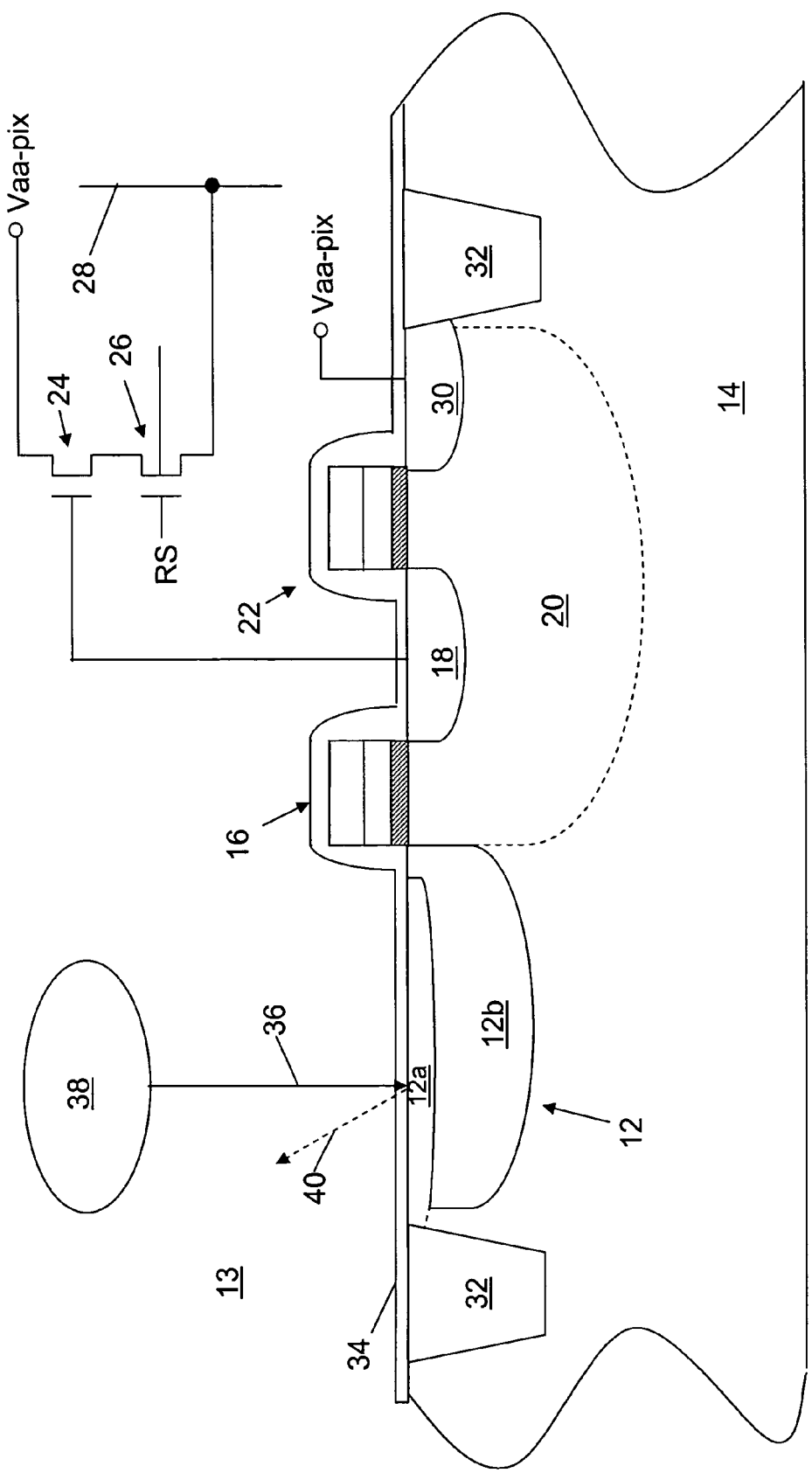
FIG. 2 illustrates a partial cross-sectional view of a conventional pixel cell.
Figure 3:
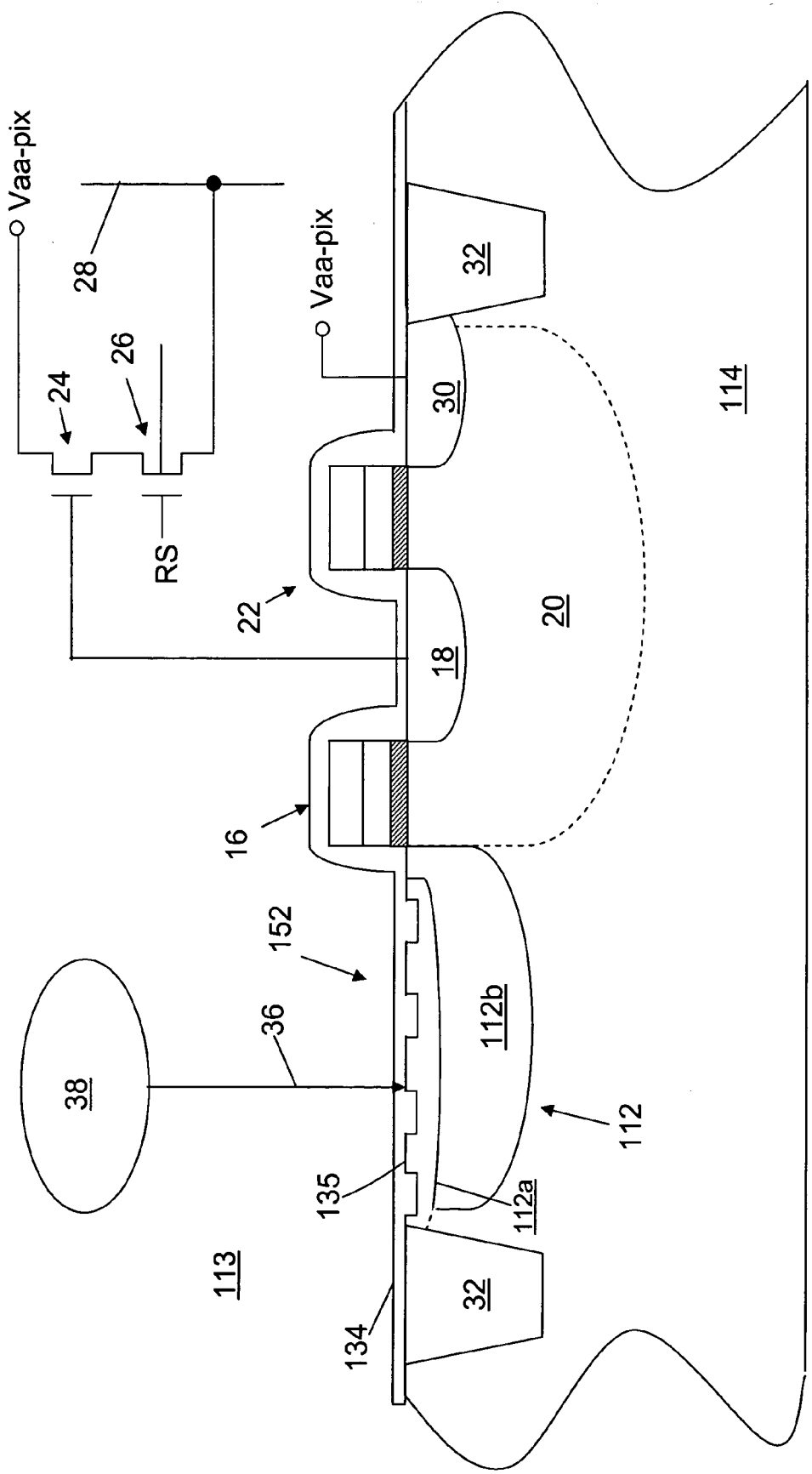
FIG. 3 illustrates a partial cross-sectional view of a pixel cell constructed in accordance with an exemplary embodiment of the invention.

Referring now to the figures, where like reference numbers designate like elements, FIG. 3 illustrates an exemplary pixel cell 113 constructed in accordance with an embodiment of the invention. Pixel cell 113 is similar to the FIG. 2 pixel cell 13 with the significant improvement of having a grated interface 135 between an oxide layer 134 and a photosensitive region 152 of the substrate 114 containing a photosensor 112.

The grated interface 135 of the pixel cell 113 serves to create a hybrid index of refraction between the oxide layer 134 and the substrate 114. In contrast to the FIG. 2 pixel cell 13, when incident light 36 strikes the pixel cell 113, the light does not meet an abrupt transition in the indexes of refraction between the oxide layer 34 (FIG. 2) and the substrate 14 (FIG. 2). Rather, the hybrid index of refraction is higher than that of the oxide layer 134, but lower than that of the silicon substrate 114, thereby decreasing the percentage of incident light reflection 40 (FIG. 2) found in the conventional pixel cell 13 (FIG. 2).

Figure 4:
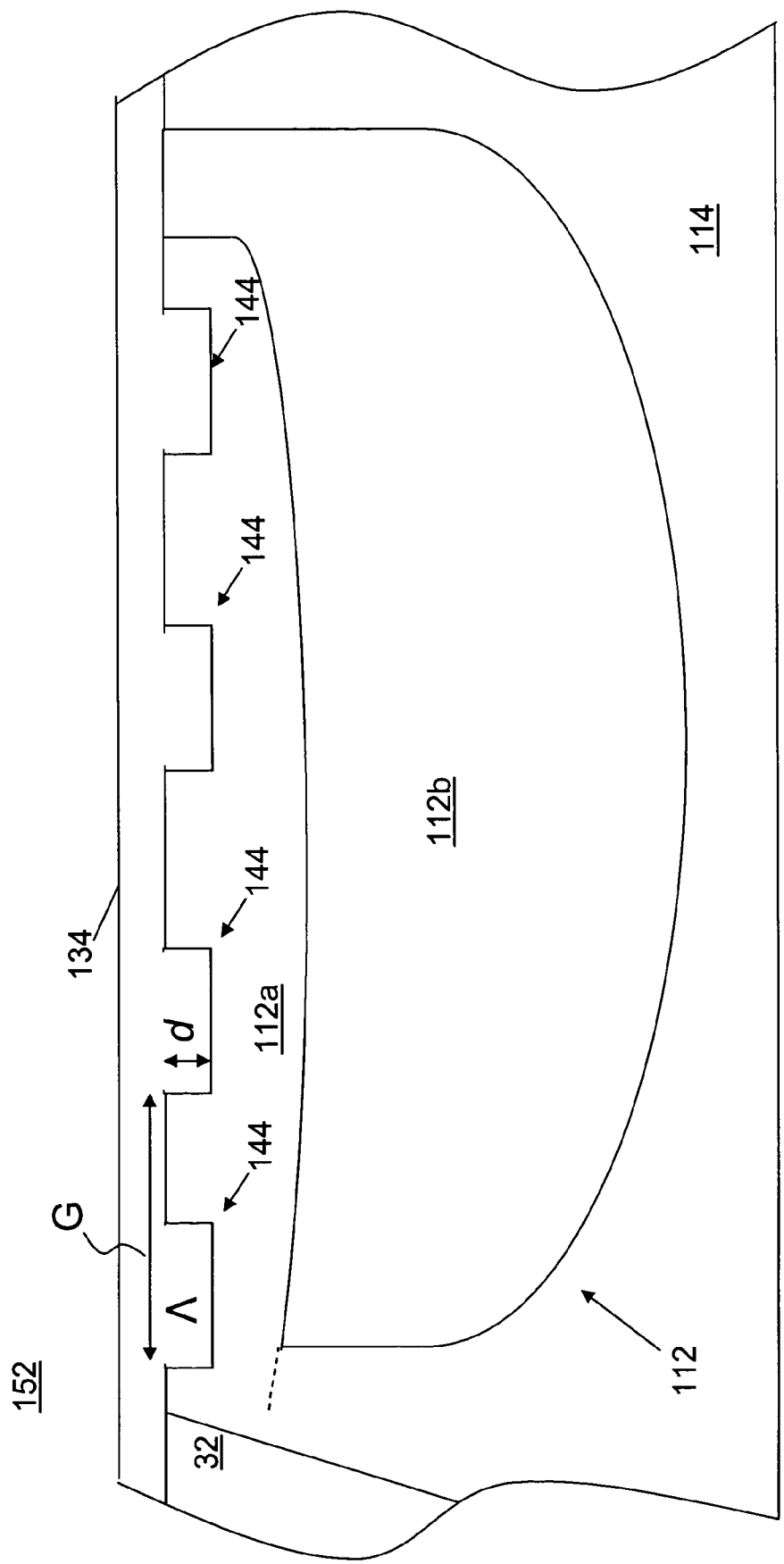
FIG. 4 illustrates a magnified portion of the photosensitive region of the FIG. 3 pixel cell.

FIG. 4 illustrates a magnified portion of the photosensitive region 152 (including photosensor 112) of the FIG. 3 pixel cell 113. FIG. 4 illustrates that the oxide layer 134 is provided within and over trenches 144 formed within the substrate 114, thereby forming the grated interface 135. Each grating (measured as the distance from the beginning of one trench 144 to the beginning of the next trench 144 (shown by arrow G)) has a predetermined period that is represented by Λ. The predetermined period Λ of the grating G may be in the range from about 100 nm to about 1000 nm. The trenches 144 also have a predetermined depth, represented by d. The depth d of the trench 144 should be in the range from about 10 nm to about 250 nm.

It should be noted that the foregoing ranges are only exemplary embodiments of the present invention, and are not limiting in any way. For example, the gratings could have periods Λ longer than 1000 nm or shorter than 100 nm. Similarly, the depth d of the trenches 144 could be deeper than 250 nm or shallower than 10 nm. The actual periods Λ and depths d can be optimized for the particular wavelength of the incident light that is intended to be captured by the photosensor 112. Although illustrated as semi-rectangular, the trenches 144 of FIG. 4 are not so limited. Rather, the actual dimensions of the trenches 144 are dependent upon the intended application.

FIGS. 5A and 5B are graphs that represent the percentage of reflection of incident light 36 (FIG. 3) as a function of varying the period Λ of the gratings and depth d of the trenches of the exemplary embodiments of the invention. FIG. 5A illustrates the percentage of incident light reflection as a function of varying the period Λ of the grating in the pixel cell 113 of the invention. As illustrated in FIG. 5A, the grating has a constant depth d equal to 100 nm. The percentage of incident light reflection is approximately 18% with no grating, as discussed above with respect to FIG. 2. The percentage of incident light reflection continues to be high where the period Λ is 1000 nm. As the period Λ of the grating is decreased, however, the percentage of incident light reflection is nearly eliminated at a period Λ of 340 nm. As the grating is further decreased, the percentage of incident light reflection increases.

FIG. 5B illustrates the percentage of incident light reflection as a function of the depth d of the trenches 144 (FIG. 4). As illustrated, the grating has a constant period Λ equal to 340 nm. The incident light reflection decreases as the depth of the trenches 144 (FIG. 4) increases, and is nearly eliminated when the trenches have a depth d of 100 nm. As the depth of the trenches increases after 100 nm, however, the percentage of incident light reflection increases as well. Therefore, the actual periods Λ and depths d could be varied depending upon the desired amount of reflection.

Figure 6:
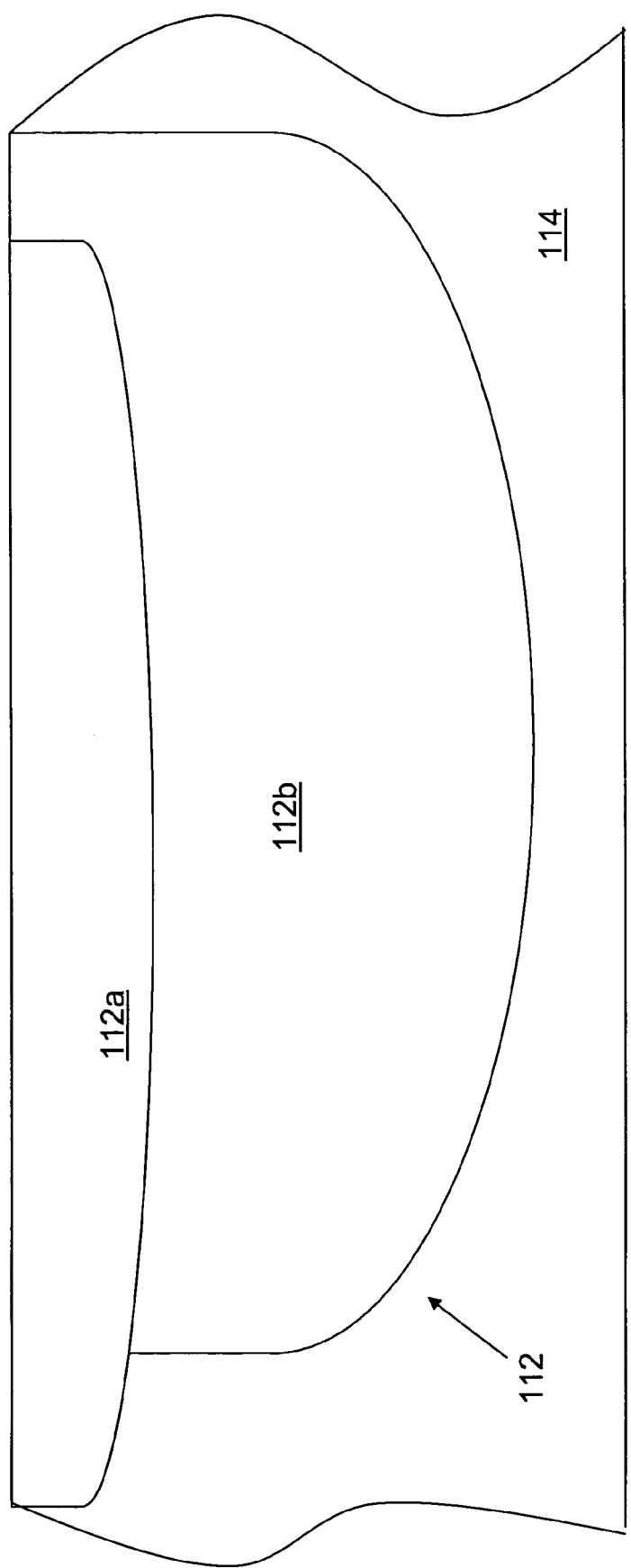
FIGS. 6-8 illustrate stages in fabrication of the FIG. 4 photosensitive region.
Figure 7:
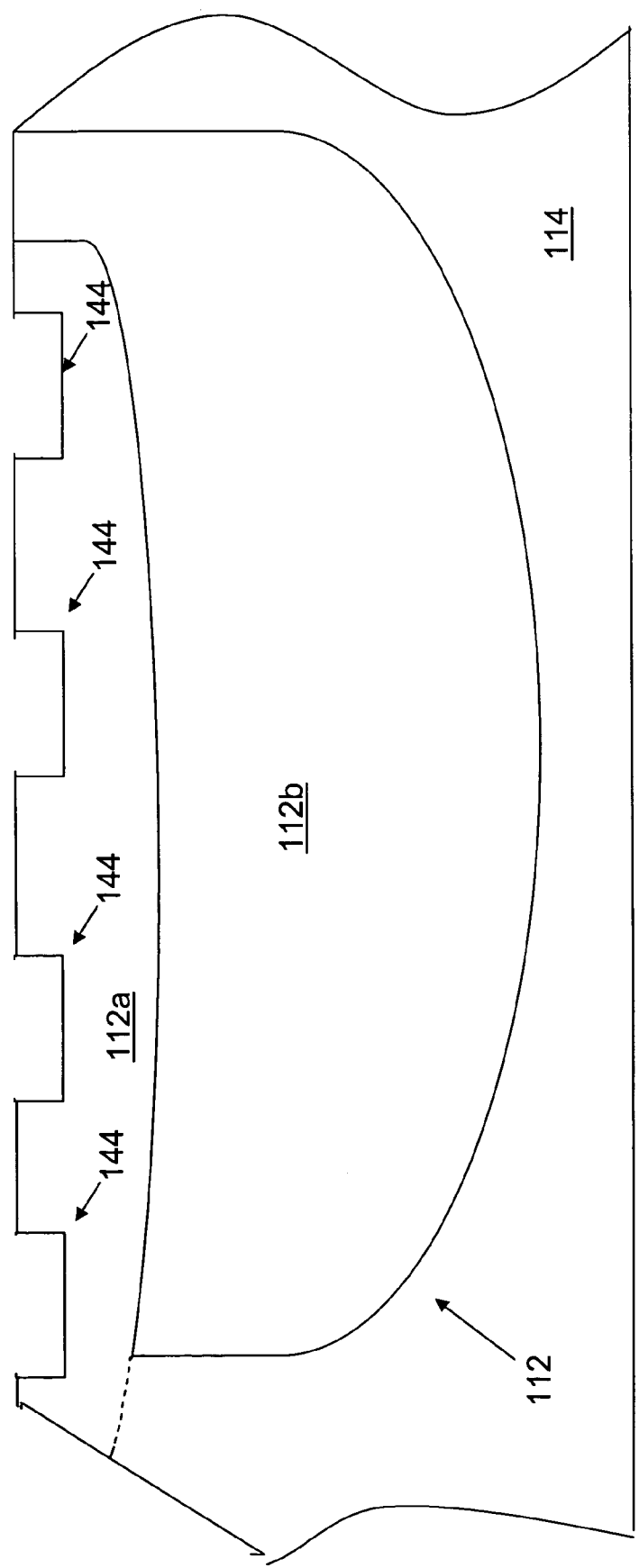
Figure 8:
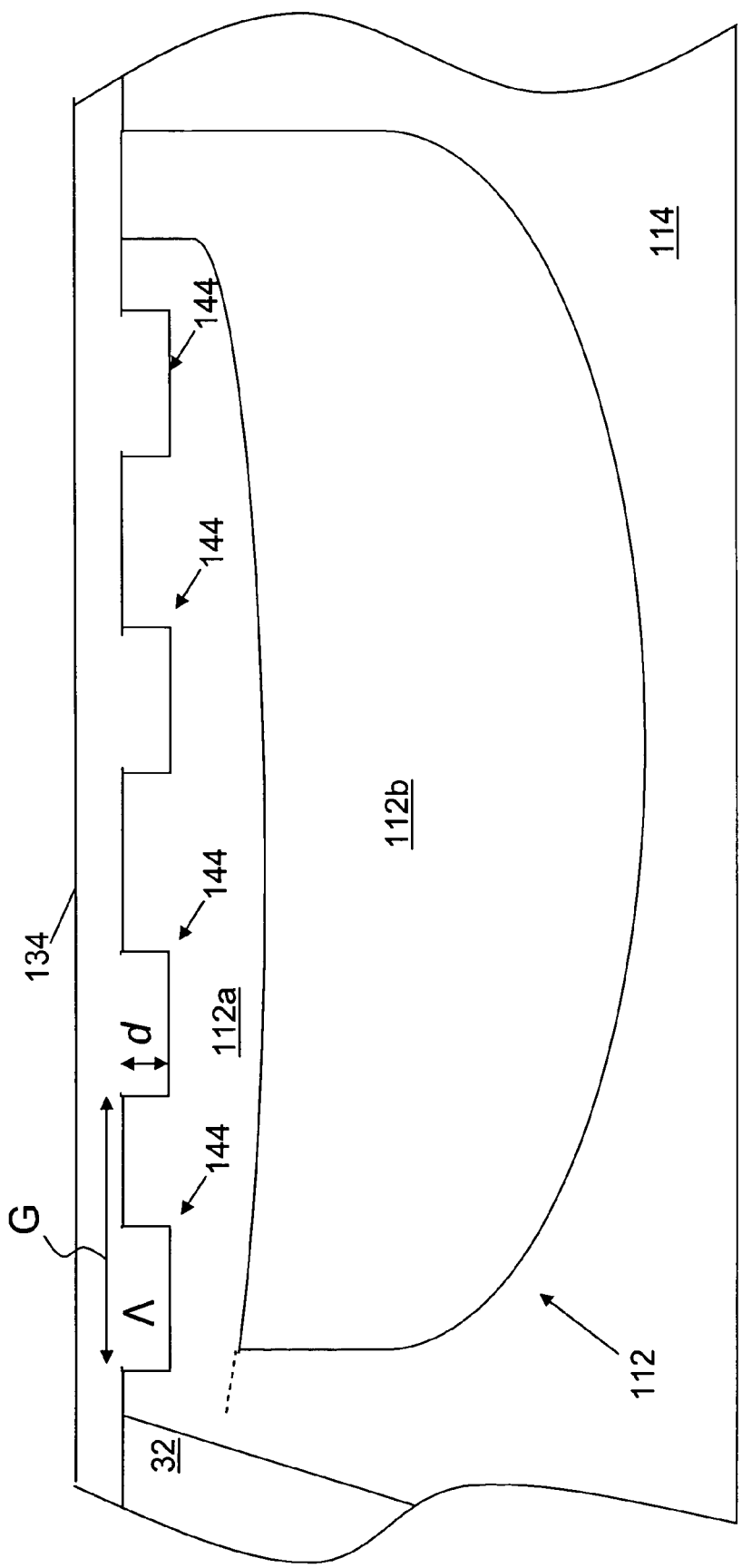

FIGS. 6-8 illustrate stages of an exemplary method of forming the FIG. 4 photosensitive region 152. FIG. 6 illustrates a photosensor 112 formed within a silicon substrate 114. The photosensor 112 has a first doped region 112a and second doped region 112b formed in the substrate 114. The first doped region 112a of the photosensor 112 is typically coupled to the potential of the substrate 114 for efficient operation. For example, if the substrate 114 is a p-type substrate, the first doped region 112a is typically a p-region. Conversely, the second doped region 112b is typically the other of a p-type or n-type region. For example, if the substrate 114 is a p-type substrate, then the second doped region 112b is typically an n-type region. It should be noted that the foregoing example is not limiting in any way. For example, the first doped region 112a and the substrate 114 could be doped with n-type dopants, and the second doped region 112b could be doped with a p-type dopant.

Although illustrated as a photodiode, the photosensor 112 is not intended to be limited in any way. For example, the photosensor 112 could be any photosensitive region capable of converting photons from incident light into electrical charges that can be stored and recalled.

FIG. 7 illustrates a plurality of trenches 144 formed within the silicon substrate over the photosensor 112. The trenches 144 could be formed by chemical etching, reactive ion etching (RIE), or other techniques for creating a recess in the silicon substrate 114. It should be noted that the foregoing methods of creating the trenches 144 that form the basis for the grated interface are not limiting in any way. For example, the trenches 144 could also be formed by laying a photoresist pattern on the silicon substrate, and creating columns of silicon substrate material by epitaxial growth, where a trench 144 is formed between each of the silicon substrate material columns.

FIG. 8 illustrates the oxide layer 134 provided over and within the trenches 144, thereby creating the grated interface G having a predetermined period Λ and having a predetermined depth d.

It should be noted that FIGS. 6-8 illustrate only one exemplary method of forming the pixel cell 113, and that the method is not intended to be limiting. For example, the plurality of trenches 144 could be formed prior to forming the photosensor 112 (i.e., before the doping steps described above). It should also be noted that various material layers (not shown) may be deposited over the oxide layer 134. For example, a tetraethyl orthosilicate ($Si(OC_2H_5)_4$) (TEOS) layer may be deposited over the oxide layer 134. Similarly, a boro-phospho-silicate glass (BPSG) layer could be deposited over the TEOS layer. A metallization layer and insulating layer can also be deposited over the oxide layer 134.

Figure 9:
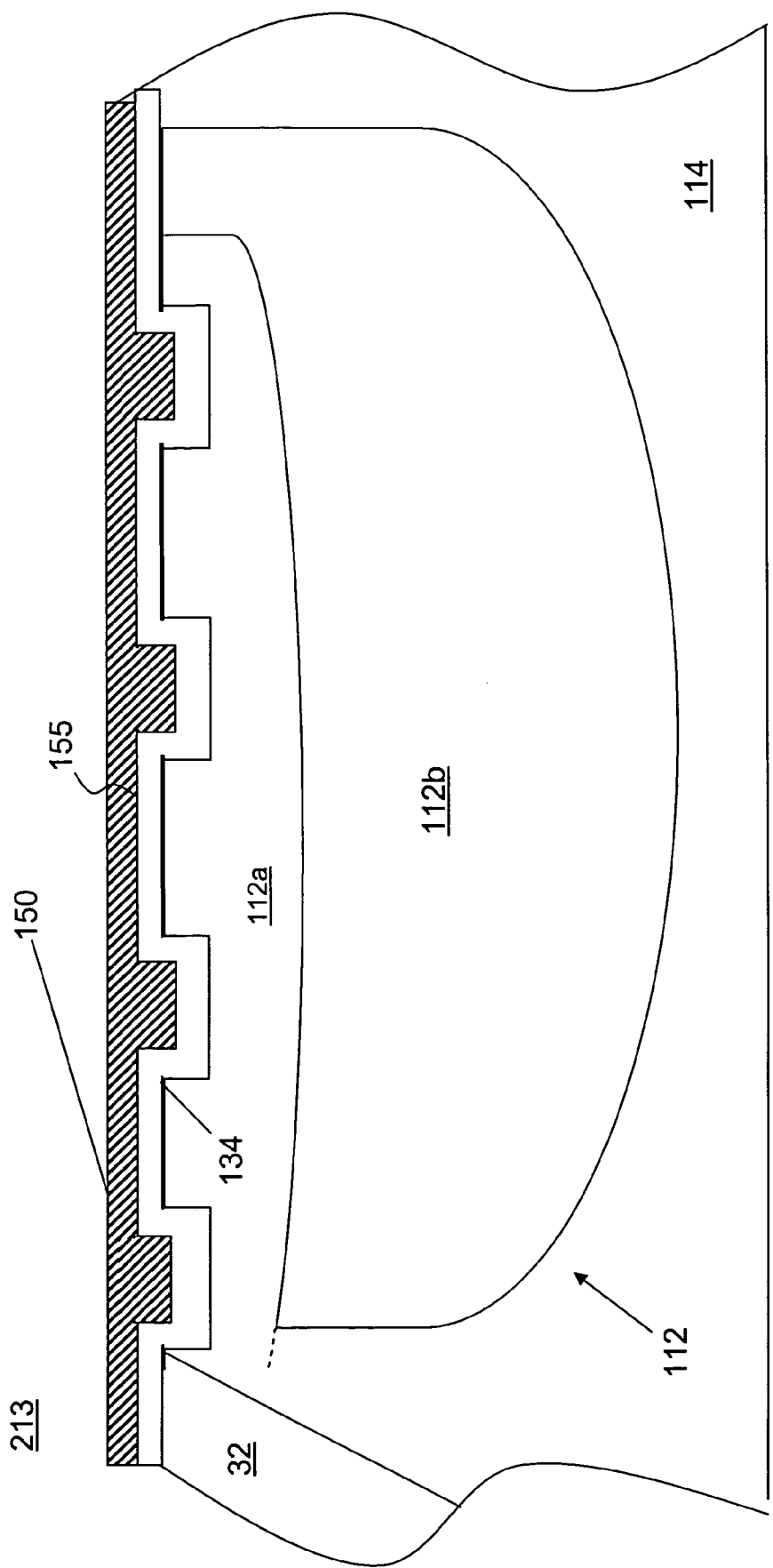
FIG. 9 illustrates a partial cross-sectional view of a pixel cell constructed in accordance with a second exemplary embodiment of the invention.

FIG. 9 illustrates a second exemplary embodiment of the present invention. Pixel cell 213 is similar to the FIG. 3 pixel cell 113, with the exception that a material layer 150 has a grated interface 155 with the oxide layer 134. The grated interface 155 may further decrease the abrupt transition that the incident light 136 (FIG. 3) may encounter as it moves through the material layer 150 to the oxide layer 134. The material layer 150 may have a disparately high or low index of refraction relative to the oxide layer 134, which may result in a high percentage of incident light reflection 40 (FIG. 2). The grated interface may increase the amount of incident light 36 (FIG. 3) that is captured by the photosensor 112.

Figure 10:
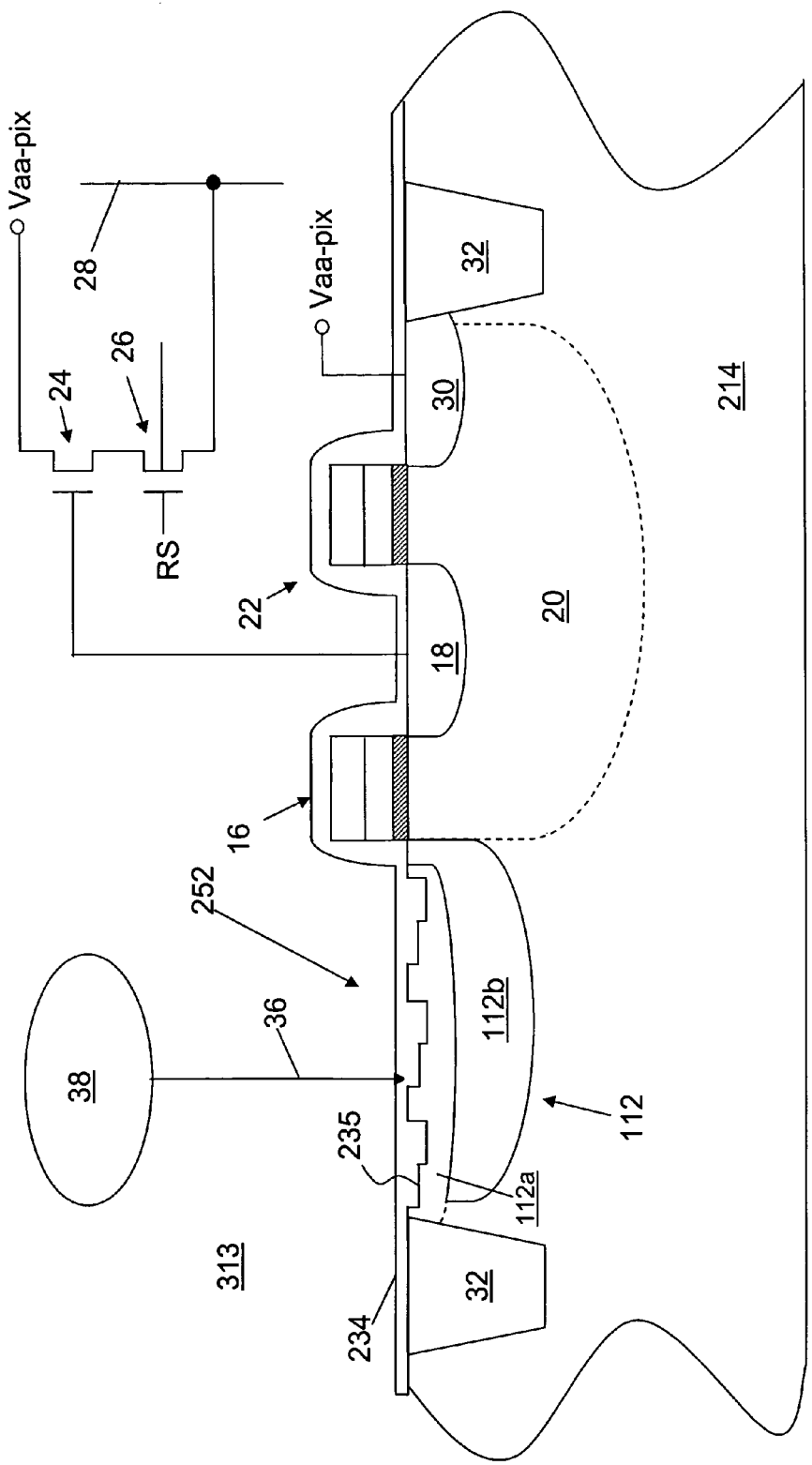
FIGS. 10 and 11 illustrate a partial cross-sectional view of a pixel cell constructed in accordance with a third exemplary embodiment of the invention.
Figure 11:
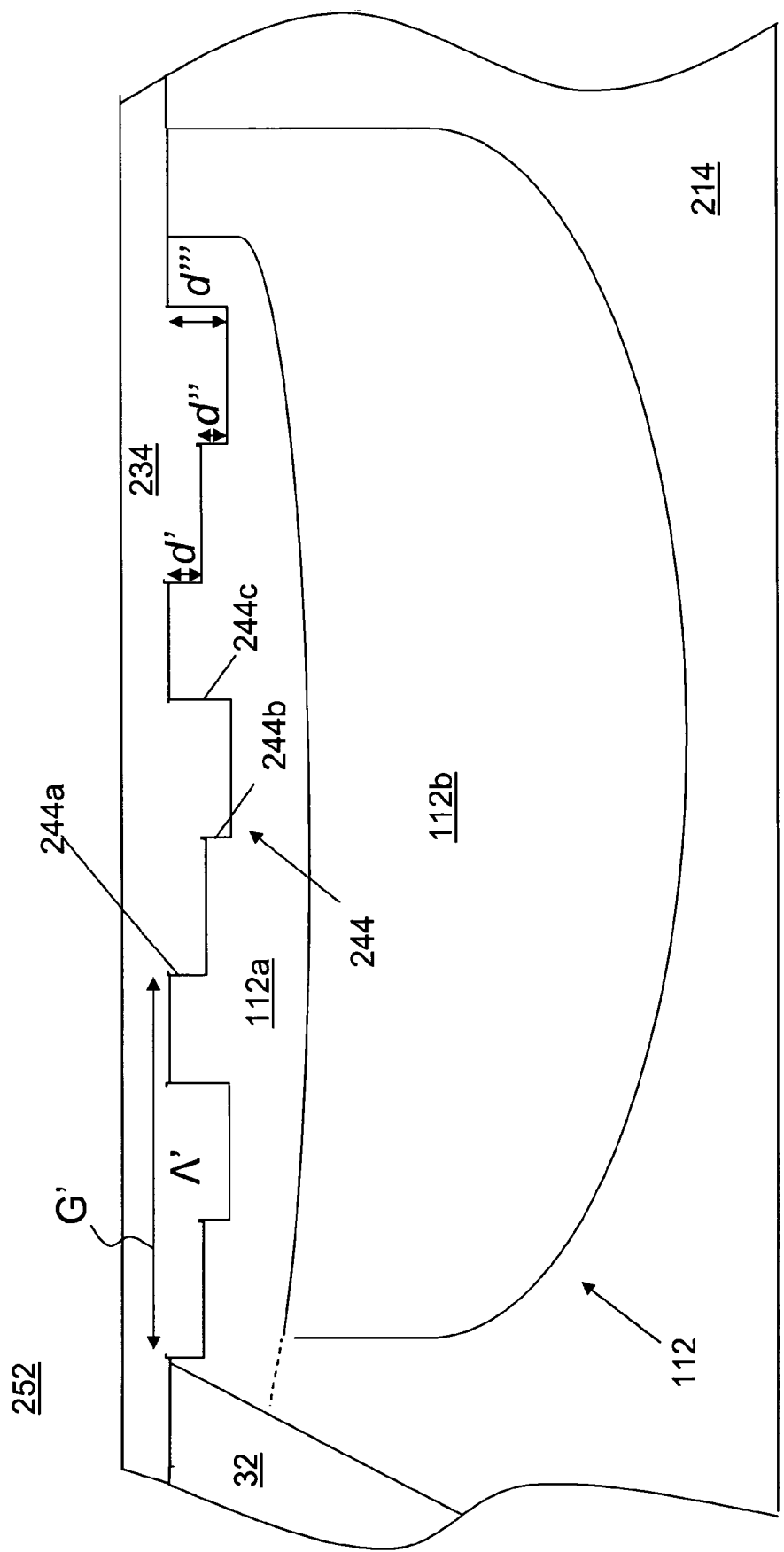

FIGS. 10 and 11 illustrate a partial cross-section of a pixel cell 313 constructed in accordance with a third exemplary embodiment of the invention. The FIG. 10 pixel cell 313 is similar to the FIG. 3 pixel cell 113 with the exception that the trenches forming the basis for the grated interface 235 between a silicon substrate 214 and an oxide layer 234 have a blazed (or step-wise) shape, rather than the semi-rectangular shape of the grated interface 135 of the FIG. 3 pixel cell 113. The blazed grating over a photosensitive region 252 of the pixel cell 313 provides for a further decrease in the disparity of indexes of refraction between the oxide layer 234 and the silicon substrate 214. The illustrated blazed interface 235 between the oxide layer 234 and the silicon substrate 214 achieves up to a 30% decrease in the incident light reflected, or a 30% increase in incident light 36 captured by the photosensor 112.

FIG. 11 illustrates a magnified portion of the photosensitive region 252 of the FIG. 10 pixel cell 313. The silicon substrate 214 has a plurality of trenches 244. The trenches 244 could be formed by any of the methods described above with respect to FIG. 4 (e.g., etching or epitaxial growth). Each of the illustrated trenches 244 has at least three sidewall regions 244a, 244b, 244c. The illustrated trench 244 has a first sidewall region 244a having a predetermined depth represented by d'. The trench 244 also has a second sidewall region 244b having a predetermined depth represented by d". The predetermined depth d" of the second sidewall region 244b could have a value less than, equal to, or greater than the depth d' of the first sidewall region 244a. The third sidewall region 244c typically has a predetermined depth represented by d'". The depth d'" of the third sidewall region 244c typically has a value equal to the depths of the first and second sidewall regions 244a, 244b combined (i.e., d'+d"=d'"). The predetermined depths d', d", d'" may have a value in the range from about 10 nm to about 250 nm.

The grating (or the distance from the beginning of one trench to the beginning of the next trench (shown as arrow G')) has a predetermined period that is represented by Λ'. The predetermined period Λ' of the grating G' may be in the range from about 100 nm to about 1000 nm.

It should be noted that the foregoing ranges are only exemplary embodiments of the present invention, and are not limiting in any way. For example, the gratings G' could have periods Λ longer than 1000 nm or shorter than 100 nm. Similarly, the depths d', d", d'" of the trenches 244 could be deeper than 250 nm or shallower than 10 nm. The actual periods Λ' and depths d', d", d'" can be manipulated depending on the intended application.

Figure 12:
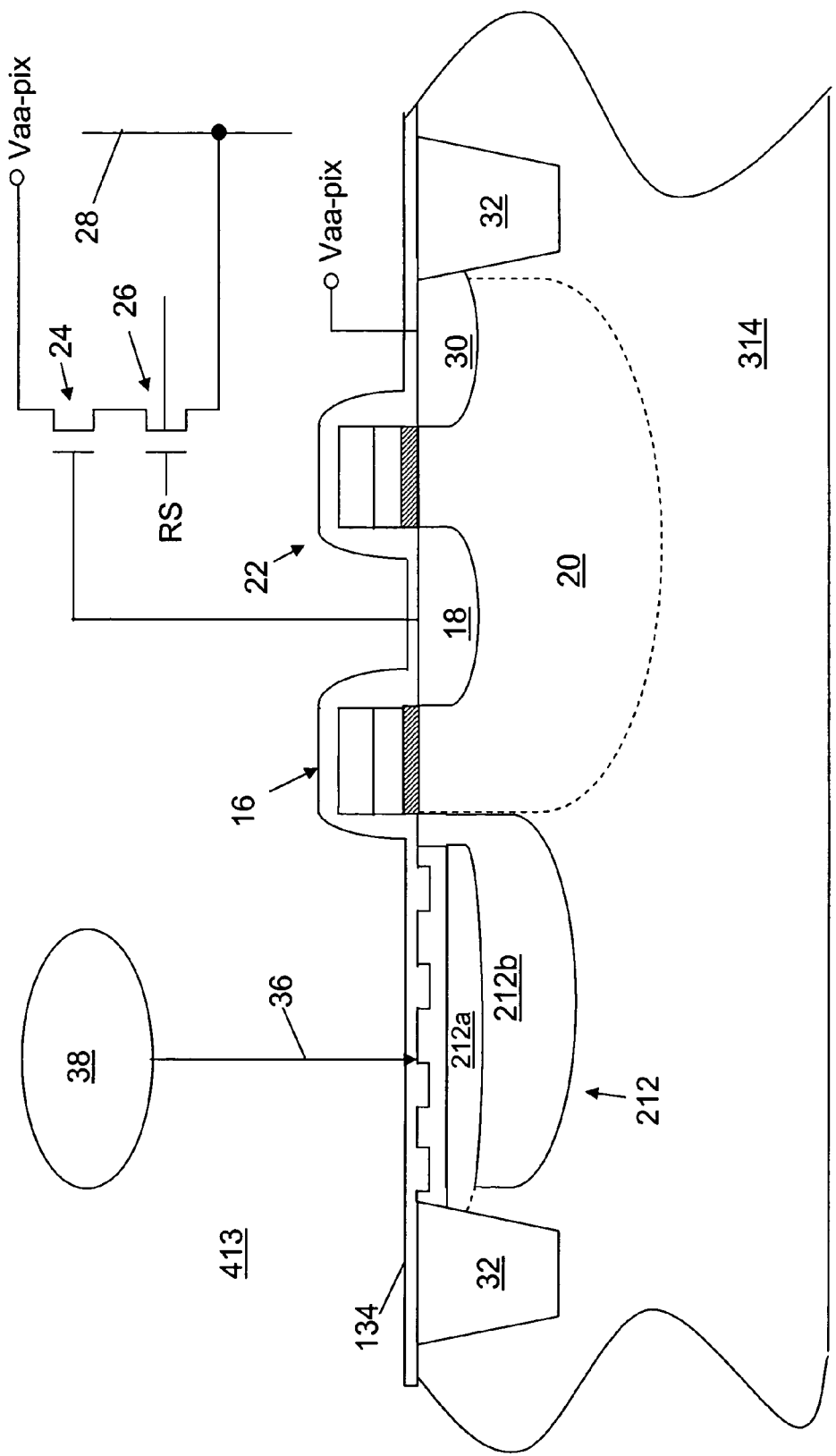
FIG. 12 illustrates a partial cross-sectional view of a pixel cell constructed in accordance with a fourth exemplary embodiment of the invention.

FIG. 12 illustrates a pixel cell 413 constructed in accordance with a fourth exemplary embodiment of the invention. The pixel cell 413 has a pinned photodiode 212 having a first doped region 212a and a second doped region 212b, formed below the surface of a substrate 314. The illustrated pixel cell 413 is otherwise similar to the FIG. 3 pixel cell 113 (including the grated interface 135).

Figure 1:
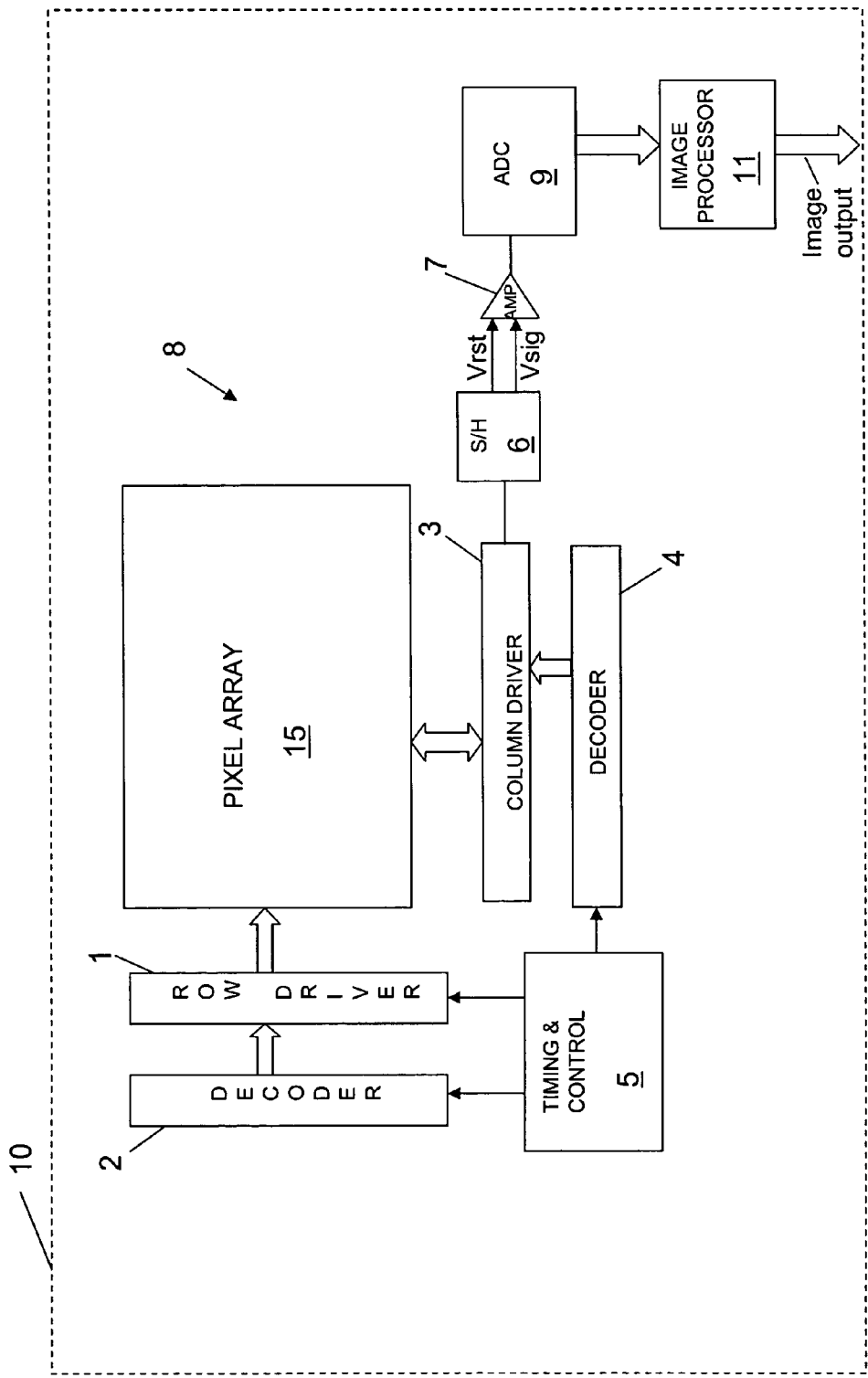
FIG. 1 illustrates a block diagram of a CMOS imager die.
Figure 13:
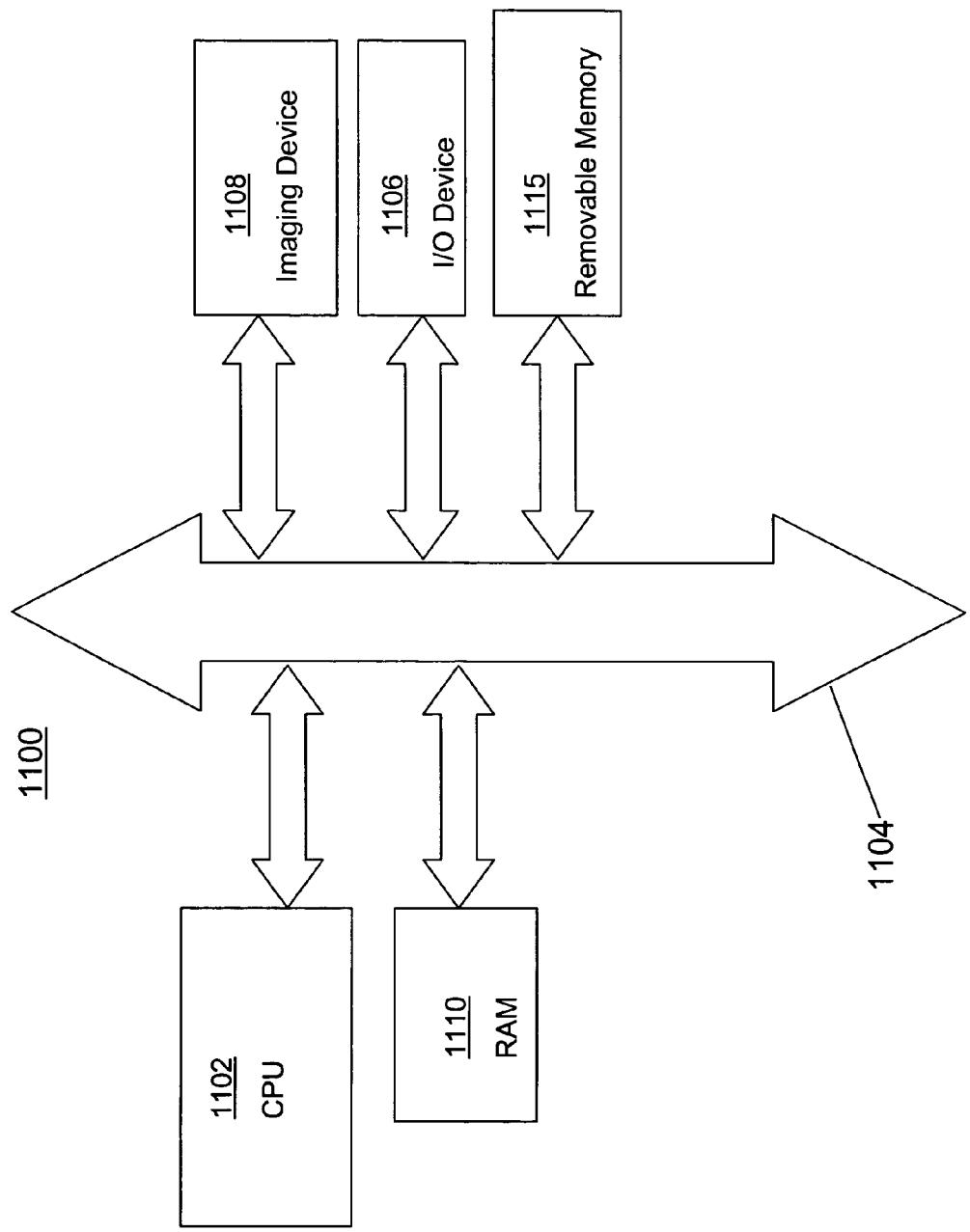
FIG. 13 is a schematic diagram of a processor system constructed in accordance with an exemplary embodiment of the invention.

The pixel cells 113, 213, 313, 413 of the invention may be combined with peripheral circuitry on an imager die similar to that illustrated in FIG. 1. For example, the pixel array 15 of the FIG. 1 imager die could include one or more of the pixel cells 113, 213, 313, 413 constructed in accordance with exemplary embodiments of the invention. The imager die having a pixel array with one or more pixel cells 113, 213, 313, 413 of the invention could be included in an imaging device. The imaging device could further be incorporated into a processor system 1100 illustrated in FIG. 13. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize the invention.

The system 1100 includes an imaging device 1108 including an imager die having the overall configuration depicted in FIG. 1 with at least one pixel cell of the pixel array 15 (FIG. 1) constructed in accordance with any of the various embodiments of the invention (e.g., pixel cells 113, 213, 313, 413). The system 1100 generally comprises a central processing unit (CPU) 1102, such as a microprocessor, that communicates with an input/output (I/O) device 1106 over a bus 1104. Imaging device 1108 also communicates with the CPU 1102 over the bus 1104. The system 1100 also includes random access memory (RAM) 1110, and can include removable memory 1115, such as flash memory, which also communicates with CPU 1102 over the bus 1104. Imaging device 1108 may be combined with a processor, such as a CPU, digital signal processor, or microprocessor, with or without memory storage on a single integrated circuit or on a different chip than the processor.

It should be noted that although the invention has been described with specific references to CMOS pixel cells having a grated interface between the silicon substrate and the oxide layer, the invention has broader applicability and may be used in any imaging apparatus. For example, the present invention may be used in conjunction with charge-coupled-device (CCD) imagers. The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. An integrated circuit comprising:
an array of pixel cells for capturing an image, at least one pixel cell of the array comprising:
a silicon substrate having a photosensor formed therein, wherein the photosensor comprises first and second doped regions, and a plurality of trenches forming a grating having a predetermined period, wherein the plurality of trenches is arranged completely within the first region so that only a portion of the first region is located directly between any two adjacent trenches.

2. The integrated circuit of claim 1, wherein the photosensor is a photodiode.

3. The integrated circuit of claim 2, wherein the photodiode is a pinned photodiode.

4. The integrated circuit of claim 1, wherein the plurality of trenches contains at least two distinct steps within each trench, each distinct step having a specific depth.

5. The integrated circuit of claim 4, wherein a first distinct step within each trench has a first depth of about 100 nm, and the period of the plurality of trenches is about 340 nm.

6. An imaging device comprising:
an imaging array containing a plurality of pixel cells, at least one pixel cell comprising:
a photosensor formed at an upper portion of a silicon substrate having first and second doped regions, the first region having a first index of refraction, and
an oxide layer, having a second index of refraction different from the first index of refraction, provided over the photosensor such that the oxide layer and the photosensor have a grated interface forming a hybrid index of refraction, the grated interface comprising,
a plurality of trenches arranged completely within the first region so that only a portion of the first region is located directly between any two adjacent trenches and the plurality of trenches having a predetermined period, and wherein
the oxide layer is provided within the plurality of trenches and over a topmost surface of the first region; and readout circuitry within the semiconductor substrate, the readout circuitry providing signals from the photosensor.

7. The imaging device of claim 6, wherein the pixel cell further comprises a material layer over the oxide layer.

8. The imaging device of claim 7, wherein the oxide layer has a grated interface with the material layer.

9. The imaging device of claim 6, wherein the photosensor is a photodiode.

10. The imaging device of claim 6, wherein the photosensor is a pinned photodiode.

11. The imaging device of claim 6, wherein each trench of the plurality of trenches comprises:
a first step having a first depth; and
a second step having a second depth different from the first depth.

12. The imaging device of claim 6, further comprising an image processor for receiving images from said imaging device.

13. The imaging device of claim 6, wherein the oxide layer total fills the trenches and the topmost surface of the oxide layer is substantially planar.

14. The integrated circuit of claim 13, wherein a second step of the at least two distinct steps within each trench has a second depth greater than the first depth.

15. The integrated circuit of claim 14, wherein the depth of the second step is within a range between 100 nm to about 250 nm.

16. An integrated circuit comprising:
a plurality of pixel cells in an array, each pixel cell having a photosensor formed in a substrate having first and second doped regions and having an associated grated interface, the grated interface for each of the photosensors comprising a plurality of trenches arranged completely within the first region so that only a portion of the first region is located directly between any two adjacent trenches, wherein each trench of the plurality of trenches comprises a plurality of stepped areas within each trench, wherein the depth from the surface of the substrate to some of the plurality of stepped areas within each trench is different than the depth from the surface of the substrate to other steps of the plurality of stepped areas within each trench.

17. The integrated circuit of claim 16, wherein the depth from the surface of the substrate to any stepped area within each trench is within a range from about 10 nm to about 250 nm.

18. The integrated circuit of claim 16, wherein the grated interface has a period of about 340 nm and the depth from the surface of the substrate to a lowest stepped area of the plurality of stepped areas is a maximum of about 100 nm.

19. An integrated circuit comprising:
an array of pixel cells for capturing an image, said array formed in a substrate, each of a plurality of pixel cells of said array comprising:
a photosensor formed within the silicon substrate and having first and second opposite conductivity type regions;
a grated interface over the photosensor and between the silicon substrate and an overlaying oxide layer, the grated interface having a plurality of trenches formed in the substrate arranged completely within the first conductivity type region so that only a portion of the first conductivity type region is located directly between any two adjacent trenches, each trench comprising a plurality of stepped areas, each stepped area within the trench having an associated depth from a surface of the first conductivity type region, wherein the associated depth of a first stepped area within the trench is different from the associated depth of a second stepped area within the trench.

20. The integrated circuit of claim 19, wherein the photosensor is a photodiode.

21. The integrated circuit of claim 20 further comprising a material provided over an upper surface of the first conductivity type region, and completely filling the plurality of trenches, the material having a different index of refraction than the substrate, the material and substrate providing an index of refraction for each grating that is lower than that of the substrate and higher than that of the material.

22. The integrated circuit of claim 19, wherein the photodiode is a pinned photodiode.

23. The integrated circuit of claim 19, wherein the grated interface for a first photosensor of one pixel cell of said array has a predetermined period and stepped-area depths that differ from a predetermined period and stepped-area depths for a second photosensor of another pixel cell of said array in accordance with the wavelength of light sensed by the photosensors.

24. A pixel array comprising:
a plurality of photodiodes formed in a semiconductor substrate for receiving incident light from a scene and for storing charges associated with the incident light, the plurality of photodiodes providing stored charges representing an image of the scene, each photodiode comprising;
a first conductivity type region provided over an upper surface of the semiconductor substrate, and
a second conductivity type region below the first conductivity type region used for storing said charges,
a plurality of grated interfaces respectively associated with the photodiodes through which the incident light passes, each of the grated interfaces comprising;
a plurality of trenches arranged completely in the first conductivity regions of a respective photodiode so that only a portion of the first conductivity region is located directly between any two adjacent trenches; and
a material provided over an upper surface of the first conductivity type region, and filling the trenches, the material having a different index of refraction than the semiconductor substrate, the material and substrate providing an index of refraction for each grating that is lower than that of the semiconductor substrate and higher than that of the material.

25. The pixel array of claim 24 wherein the first conductivity type region is p-type and the second conductivity type region is n-type and the semiconductor substrate is p-type.

26. The pixel array of claim 24 wherein the first conductivity type region is n-type and the second conductivity type region is p-type and the semiconductor substrate is n-type.

27. The pixel array of claim 24 wherein the plurality of trenches in the first conductivity region of a respective photodiode have a substantially semi-rectangular shape.

28. The pixel array of claim 24 wherein at least one of the plurality of trenches in the first conductivity region of a respective photodiode has a predetermined depth within a range from about 10 nm to about 250 nm, and the grated interface has a predetermined period within a range from about 100 nm to about 1000 nm.

29. The pixel array of claim 24 wherein the plurality of trenches in the first conductivity region of a respective photodiode have a plurality of different depths.

30. The pixel array of claim 24 further comprising a layer over the material layer, the layer selected from the group consisting of a metallization layer and an insulating layer.

31. The pixel array of claim 24 further comprising an insulating layer over the material layer, the insulating layer comprising tetraethyl orthosilicate.

32. The pixel array of claim 24 wherein a first plurality of photodiodes of the pixel array have a grated interface different from other photodiodes of the pixel array.

33. The pixel array of claim 24 further comprising a first plurality of photodiodes for detecting first wavelengths of light and a second plurality of photodiodes for detecting second wavelengths of light, and wherein the grated interface corresponding to the first plurality of photodiodes is different from the grated interface corresponding to the second plurality of photodiodes.

34. A pixel array comprising:
a plurality of photodiodes formed in a semiconductor substrate for receiving incident light from a scene and for storing charges associated with the incident light, the plurality of photodiodes providing stored charges representing an image of the scene, each photodiode comprising;
a first conductivity type region provided over an upper surface of the semiconductor substrate, and
a second conductivity type region below the first conductivity type region used for storing said charges,
a plurality of grated interfaces respectively associated with the photodiodes through which the incident light passes, each of the grated interfaces comprising;
a plurality of trenches arranged completely in the first conductivity regions of a respective photodiode so that only a portion of the first conductivity region is located directly between any two adjacent trenches; and
a material provided over an upper surface of the first conductivity type region, and filling the trenches, wherein a first plurality of the photodiodes have a grated interface different from that of other photodiodes of the array.

35. The pixel array of claim 34 wherein the grated interface of the first plurality of photodiodes comprises a plurality of trenches in the semiconductor substrate having a predetermined period, each trench of the first plurality of photodiodes comprising;
  a first step having a first depth, and
  a second step having a second depth different form the first depth.

36. The pixel array of claim 34 wherein the grated interface of the first plurality of photodiodes comprises a plurality of trenches in the semiconductor substrate having a predetermined period, each trench of the first plurality of photodiodes containing a plurality of sidewalls, wherein a first edge sidewall is at one end of a trench, a second edge sidewall is at an end opposite the first end, and at least one transition sidewall resides between the first edge sidewall and the second edge sidewall.

37. The pixel array of claim 34 wherein the grated interface of the first plurality of photodiodes comprises a plurality of trenches wherein each trench comprises a plurality of stepped areas within each trench, wherein the depth from the surface of the substrate to some of the plurality of stepped areas within each trench is different than the depth from the surface of the substrate other steps of the plurality of stepped areas within each trench.

\* \* \* \* \*